US012639493B2

(12) United States Patent
Alward et al.

(10) Patent No.: US 12,639,493 B2
(45) Date of Patent: May 26, 2026

(54) INTELLIGENT CARBONATE PETROPHYSICAL TECHNIQUES FOR ENERGY DEVELOPMENT OPERATIONS

(71) Applicant: Schlumberger Technology Corporation, Sugar Land, TX (US)

(72) Inventors: Wassem Maitham Abbas Alward, Basrah (IQ); Mohammed Jumaah Abdulkare Al-Jubouri, Erbil (IQ)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 275 days.

(21) Appl. No.: 18/655,022

(22) Filed: May 3, 2024

(65) Prior Publication Data

US 2025/0342292 A1 Nov. 6, 2025

(51) Int. Cl.
*G06F 30/00* (2020.01)
*G06F 30/27* (2020.01)
*G06N 20/00* (2019.01)

(52) U.S. Cl.
CPC ............. *G06F 30/27* (2020.01); *G06N 20/00* (2019.01)

(58) Field of Classification Search
CPC ...... G06F 30/00; G06F 30/27; E21B 2200/20; G06N 20/00
USPC ........................................................ 703/10, 6
See application file for complete search history.

(56) References Cited

U.S. PATENT DOCUMENTS

| | | | | |
|---|---|---|---|---|
| 2014/0320126 | A1 | 10/2014 | Heaton et al. | |
| 2022/0187492 | A1 | 6/2022 | Colombo et al. | |
| 2022/0260746 | A1 * | 8/2022 | Al-Malki | ............... G01V 5/045 |
| 2023/0133700 | A1 | 5/2023 | Chen et al. | |

(Continued)

FOREIGN PATENT DOCUMENTS

| | | | | |
|---|---|---|---|---|
| CN | 110717249 A | * | 1/2020 | ............. E21B 47/00 |
| CN | 116556933 A | * | 8/2023 | ............. E21B 49/00 |

OTHER PUBLICATIONS

Zhao, Wenjun et al., "Approaches of Combining Machine Learning with NMR-Based Pore Structure Characterization for Reservoir Evaluation", Mar. 27, 2024, MDPI. (Year: 2024).*

(Continued)

*Primary Examiner* — Cedric Johnson
(74) *Attorney, Agent, or Firm* — Kyle R. Miiller

(57) ABSTRACT

Disclosed are methods, systems, and computer programs for generating petrophysical analysis data. The methods include: accessing first porosity data and first well log data associated with an NMR well; randomly selecting data elements comprised in the first porosity data and the first well log data; developing, based on the randomly selected first porosity data and first well log data, a learning data structure; generating, based on the learning data structure, a machine learning model; receiving second well log data using sensor(s) deployed about a non-NMR well; adapting, based on the second well log data, variable input parameters of the machine learning model to generate second porosity data; and formatting the second porosity data to generate petrophysical analysis data. The petrophysical analysis data indicates one or more of: a petrophysical characterization of a rock type; flow dynamic data of a carbonate reservoir; well test or perforation zone data; and pore data.

20 Claims, 5 Drawing Sheets

(56) References Cited

U.S. PATENT DOCUMENTS

| | | | |
|---|---|---|---|
| 2024/0084688 A1* | 3/2024 | Tarabbia | ............... E21B 47/022 |
| 2024/0141773 A1 | 5/2024 | Ma et al. | |

OTHER PUBLICATIONS

Shao, Wei et al., "Improved RBF-Based MNR Pore-Throat Size, Pore Typing, and Permeability Models for Middle East Carbonates", Sep. 26-28, 2016, SPE Annual Technical Conference and Exhibition, Society of Petroleum Engineers. (Year: 2016).*

Mustafa, Ayyaz Ayyaz et al., "A Data Driven Machine Learning Approach to Predict the Nuclear Magnetic Resonance Porosity of the Carbonate Reservoir", Feb. 21-23, 2022, International Petroleum Technology Conference, Society of Petroleum Engineers. (Year: 2022).*

* cited by examiner

ACCESSING A DATABASE COMPRISING: FIRST POROSITY DATA ASSOCIATED WITH A NUCLEAR MAGNETIC RESONANCE (NMR) WELL; AND FIRST WELL LOG DATA ASSOCIATED WITH THE NMR WELL
402

RANDOMLY SELECTING ONE OR MORE DATA ELEMENTS COMPRISED IN THE FIRST POROSITY DATA AND THE FIRST WELL LOG DATA
404

DEVELOPING, BASED ON THE RANDOMLY SELECTED FIRST POROSITY DATA AND FIRST WELL LOG DATA, A LEARNING DATA STRUCTURE
406

GENERATING, BASED ON THE LEARNING DATA STRUCTURE, A MACHINE LEARNING MODEL, THE GENERATING COMPRISING: CONFIGURING ONE OR MORE PARAMETERS OF THE MACHINE LEARNING MODEL BASED ON THE RANDOMLY SELECTED FIRST POROSITY DATA AND FIRST WELL LOG DATA; ADAPTING OR CHANGING THE ONE OR MORE PARAMETERS OF THE MACHINE LEARNING MODEL DURING A SIMULATION INVOLVING THE MACHINE LEARNING MODEL; AND VALIDATING THE MACHINE LEARNING MODEL BY DETERMINING A PREDICTION SCHEMA OR AN EXPECTED VALUE SET BASED ON TRANSFORMING THE ONE OR MORE PARAMETERS OF THE MACHINE LEARNING MODEL INTO VARIABLE INPUT PARAMETERS THAT GENERATE SECOND POROSITY DATA COMPRISED IN, OR ASSOCIATED WITH THE EXPECTED VALUE SET
408

RECEIVING SECOND WELL LOG DATA USING ONE OR MORE SENSORS DEPLOYED ABOUT A NON-NMR WELL
410

ADAPTING, BASED ON THE SECOND WELL LOG DATA, THE VARIABLE INPUT PARAMETERS OF THE MACHINE LEARNING MODEL TO GENERATE THE SECOND POROSITY DATA COMPRISED IN THE EXPECTED VALUE SET AND ASSOCIATED WITH THE NON-NMR WELL
412

FORMATTING THE SECOND POROSITY DATA TO GENERATE PETROPHYSICAL ANALYSIS DATA, THE PETROPHYSICAL ANALYSIS DATA COMPRISING A VISUALIZATION INDICATING ONE OR MORE OF: A PETROPHYSICAL CHARACTERIZATION OF A ROCK TYPE ASSOCIATED WITH THE NON-NMR WELL; FLOW DYNAMIC DATA OF A CARBONATE RESERVOIR ASSOCIATED WITH THE NON-NMR WELL; WELL TEST OR PERFORATION ZONE DATA ASSOCIATED WITH THE NON-NMR WELL; AND PORE DATA ASSOCIATED WITH THE NON-NMR WELL
414

*FIG. 4*

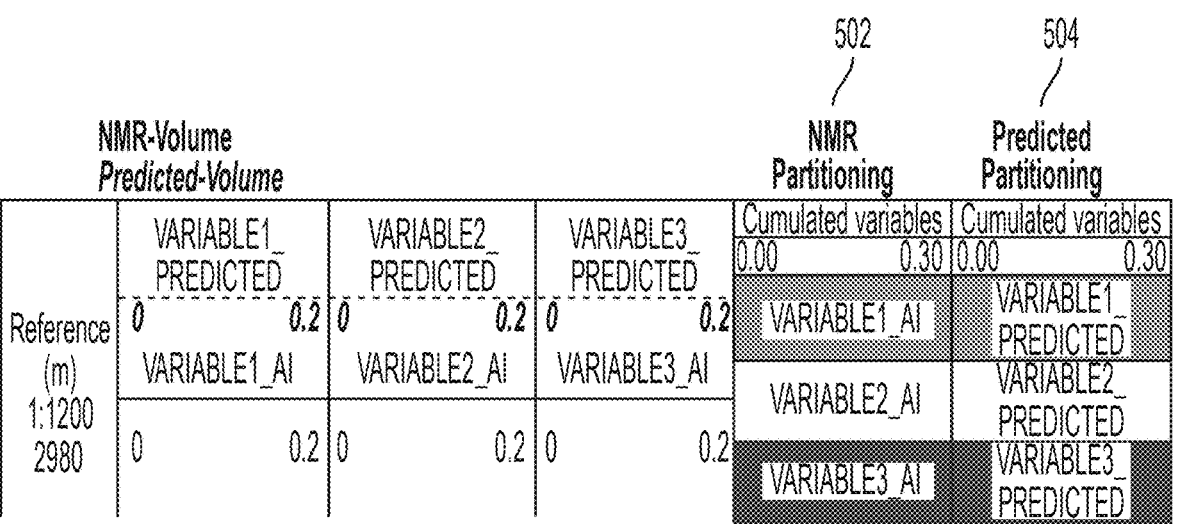
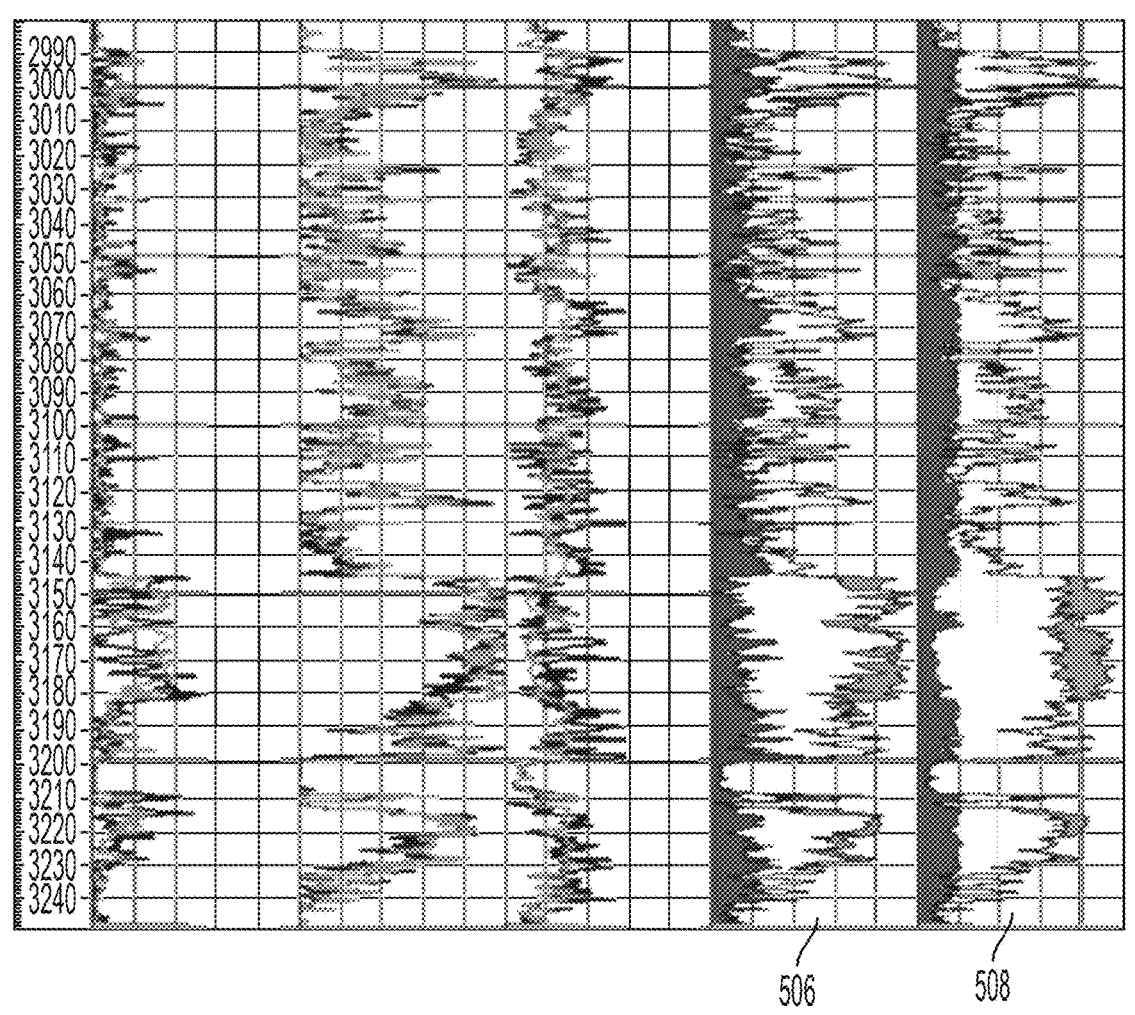
*FIG. 5*

INTELLIGENT CARBONATE PETROPHYSICAL TECHNIQUES FOR ENERGY DEVELOPMENT OPERATIONS

INTRODUCTION

This disclosure is directed to methods, systems, and computer programs associated with machine learning techniques for petrophysical analysis that drive energy development operations.

BACKGROUND

Performing petrophysical interpretation in carbonate geological structures requires advanced log measurements that rely on, for example, nuclear magnetic resonance (NMR) data and/or geological image logs. The NMR measurements and/or other geological image logs are often not available for most wells and often involve very costly and time-intensive operations that are impractical when analyzing a plurality of wells, in aggregate, to facilitate energy development operations.

Moreover, the amount of time with associated costs involved in initiating the acquisition of, for example, NMR data for a new resource site is rather substantial and requires advanced expertise that may also not be readily available.

There is therefore a need to generate petrophysical analysis data for resource sites that do not have deployed NMR systems.

SUMMARY

Disclosed are methods, systems, and computer programs for generating petrophysical analysis data for energy development operations. According to an embodiment, a method for generating petrophysical analysis data for energy development operations comprises accessing a database comprising: first porosity data associated with a nuclear magnetic resonance (NMR) well; and first well log data associated with the NMR well. The method also comprises: randomly selecting one or more data elements comprised in the first porosity data and the first well log data; developing, based on the randomly selected first porosity data and first well log data, a learning data structure; and generating, based on the learning data structure, a machine learning model. In one embodiment, generating the learning data structure comprises: configuring one or more parameters of the machine learning model based on the randomly selected first porosity data and first well log data; adapting or changing the one or more parameters of the machine learning model during a simulation involving the machine learning model; and validating the machine learning model by determining a prediction schema or an expected value set based on transforming the one or more parameters of the machine learning model into variable input parameters that generate second porosity data comprised in, or associated with the expected value set. The method further comprises: receiving second well log data using one or more sensors deployed about a non-NMR well; adapting, based on the second well log data, the variable input parameters of the machine learning model to generate the second porosity data comprised in the expected value set and associated with the non-NMR well; and formatting the second porosity data to generate petrophysical analysis data. The petrophysical analysis data, according to one embodiment, comprises a visualization indicating one or more of: a petrophysical characterization of a rock type associated with the non-NMR well; flow dynamic data of a carbonate reservoir associated with the non-NMR well; well test or perforation zone data associated with the non-NMR well; and pore data associated with the non-NMR well.

In other embodiments, a system and a computer program can include or execute the method described above. These and other implementations may each optionally include one or more of the following features.

The first porosity data includes at least one of first micro-porosity data, first meso-porosity data, and first macro-porosity data. The first well log data includes at least one of first sonic velocity data, first bulk density data, first resistivity data, and first gamma ray data.

In some embodiments, the first porosity data and the first well log data, in aggregate, are split into a training dataset and a testing data set prior to being used to generate the machine learning model.

In addition, the learning data structure comprises a random forest learning data structure including a collection of decision trees that are organized based on the randomly selected porosity data and well log data.

Moreover, the second porosity data is used to generate carbonate rock data comprised in the petrophysical analysis data.

In some cases, the second porosity data is used to generate carbonate permeability data comprised in the petrophysical analysis data.

Furthermore, the second porosity data is used to generate Bruggeman m data with corresponding Archie saturation data.

The petrophysical analysis data referenced in the above method is used to generate a development plan for a resource site that drives energy exploration operations including: drilling specific areas of the resource site; or placing one or more of wells or energy exploration equipment at the resource site.

The pore data discussed in the above method informs execution of drilling operations at the resource site.

In exemplary implementations, adapting or changing the one or more parameters of the machine learning model during the simulation involving the machine learning model comprises executing one of: a supervised learning operation on the machine learning model based on configuring the one or more parameters of the machine learning model based on the randomly selected first porosity data and first well log data; or an unsupervised learning operation on the machine learning model based on configuring the one or more parameters of the machine learning model based on the randomly selected first porosity data and first well log data.

Moreover, the machine learning model is trained using data derived from a first well about which is deployed one or more NMR sensors. Moreover, the machine learning model is applied to data derived from a second well about which there is no deployed NMR sensor.

BRIEF DESCRIPTION OF THE DRAWINGS

The disclosure is illustrated by way of example, and not by way of limitation in the figures of the accompanying drawings in which like reference numerals are used to refer to similar elements. It is emphasized that various features may not be drawn to scale and the dimensions of various features may be arbitrarily increased or reduced for clarity of discussion.

FIG. 4 provides an exemplary workflow for methods, systems, and computer programs for generating petrophysical analysis data for energy development operations.

FIG. 5 provides an exemplary visualization comprised in the petrophysical analysis data.

DETAILED DESCRIPTION

According to one embodiment, this disclosure provides methods and systems that apply machine learning to predict or otherwise generate petrophysical analysis data including porosity partitioning data using log or geological measurements including neutron measurements, sonic measurements, density measurements, and/or resistivity measurements in geological structures (e.g. wells, reservoirs, etc.) where NMR data is unavailable. Once said measurements are obtained, they can be consumed in downstream workflows to perform additional analysis including one or more of permeability analysis, rock typing analysis, saturation per pore type analysis, Bruggeman m analysis, etc. This approach greatly improves petrophysical interpretations for carbonate subsurface structures such that said petrophysical interpretations can serve as inputs that otherwise would not be available unless NMR data is obtained.

Nuclear magnetic resonance (NMR) data or measurements are often scarce and often unavailable for most wells. As such available NMR data for carbonate porosity partitioning including micropore data, mesopore, and/or macropore data can be generated and used as training data for a geo-model (e.g., porosity partitioning model or geological interpretation model) that is powered or driven by a machine learning (ML) engine. In one embodiment, the machine learning engine can enable the geo-model to predict porosity partitions using non-NMR data such as sonic measurements, density measurements, neutron measurements, and resistivity measurements. In one embodiment, the sonic measurements, density measurements, neutron measurements, and resistivity measurements can be determined without the exorbitant costs and difficulty associated with acquiring NMR data. This beneficially facilitates executing advanced geological data interpretation operations including carbonate interpretation operations across a geological site having, for example, one or more wells that do not have associated NMR measurements.

High-Level Flowchart

Figure 1:
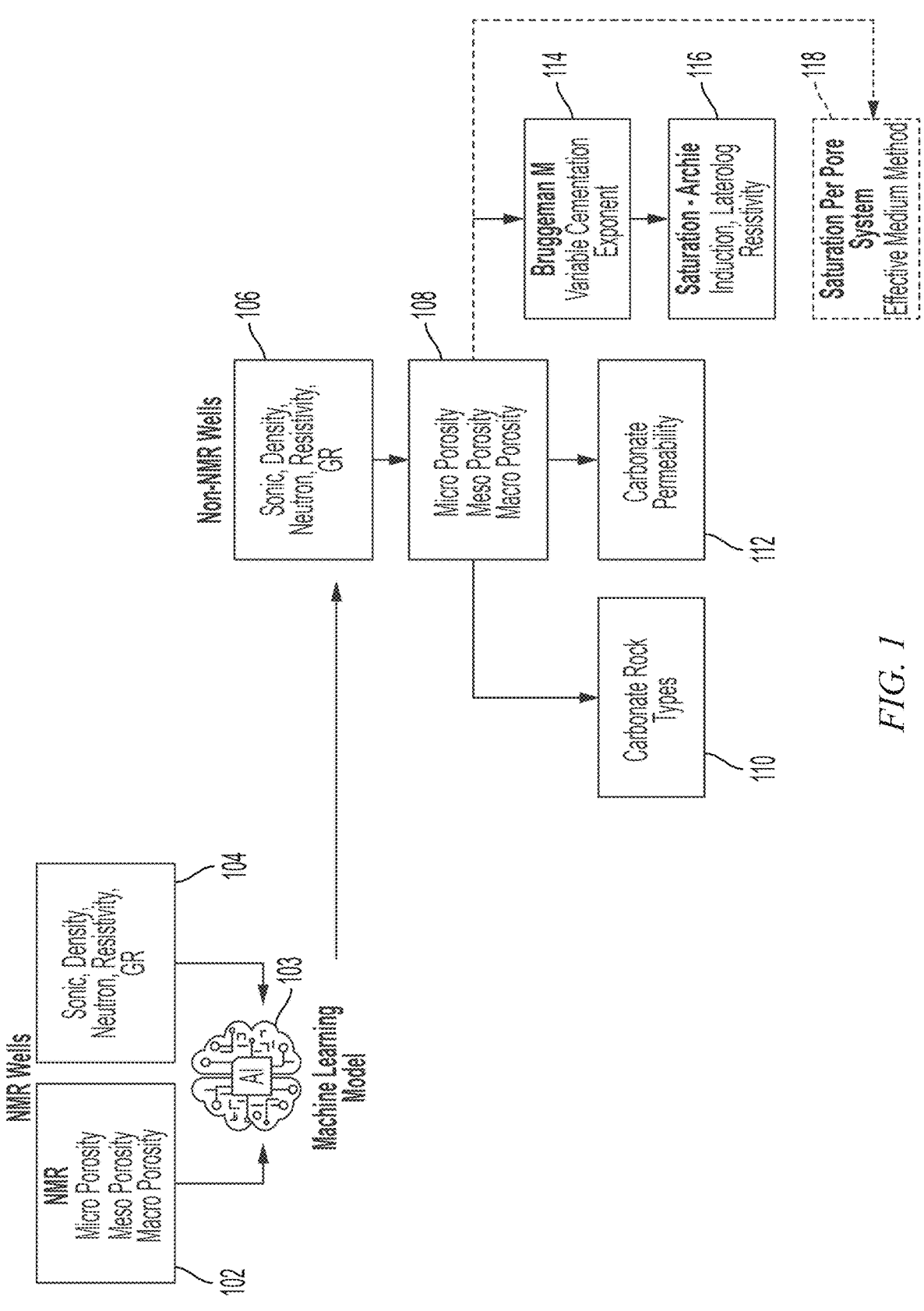
FIG. 1 shows an exemplary high-level flowchart for analyzing non-nuclear magnetic resonance (NMR) wells using a trained machine learning model or an AI model.

FIG. 1 shows an exemplary high-level flowchart for analyzing non-nuclear magnetic resonance (NMR) wells using a trained machine learning model. At block 102, a signal processing engine may access porosity data including first micro-porosity data, first meso-porosity data, and first macro-porosity data. In one embodiment, the porosity data is derived or obtained from a well using NMR sensors. In addition, the signal processing engine may apply the porosity data to a machine learning model 103.

The signal processing engine may also access one or more of first well log data (e.g., well log data associated with an NMR well) including first sonic data and/or first density data and/or first resistivity data and/or first gamma ray data at block 104 which is similarly applied to the machine learning model 103. According to one embodiment, applying the porosity data and/or the well log data to the machine learning model 103 comprises: configuring one or more parameters of the machine learning model 103 based on the porosity data and/or the well log data; adapting or changing said one or more parameters of the machine learning model during one or more simulations; and establishing a prediction schema or an expected value set based on transforming the one or more parameters of the machine learning model into variable input parameters that generate second output data comprised in the expected value set; and/or validating the machine learning model by determining a prediction schema or an expected value set or an expected value space based on transforming the one or more parameters of the machine learning model into variable input parameters that generate second porosity data comprised in, or associated with the expected value set.

At block 106, the signal processing engine may apply second well log data (e.g., well log data associated with a non-NMR well) to the variable input parameters of the trained machine learning model and thereby variably configure said variable input parameters. The second well log data may include second sonic data and/or second density data and/or second neutron data and/or second resistivity data and/or second gamma ray data obtained from a non-NMR well. The signal processing engine may be used, at block 108, to generate the second porosity data (e.g., comprised in the expected value set) based on applying the second well log data to the variable input parameters of the trained machine learning model. In one embodiment, the signal processing engine may generate, based on the second porosity data, one or more of: carbonate rock data at block 110; carbonate permeability data at block 112; Bruggeman m data at block 114 with corresponding Archie saturation data at block 116; and saturation per pore data at block 118. These aspects are further discussed in detail in association with FIG. 4, for example.

Resource Site

Figure 2:
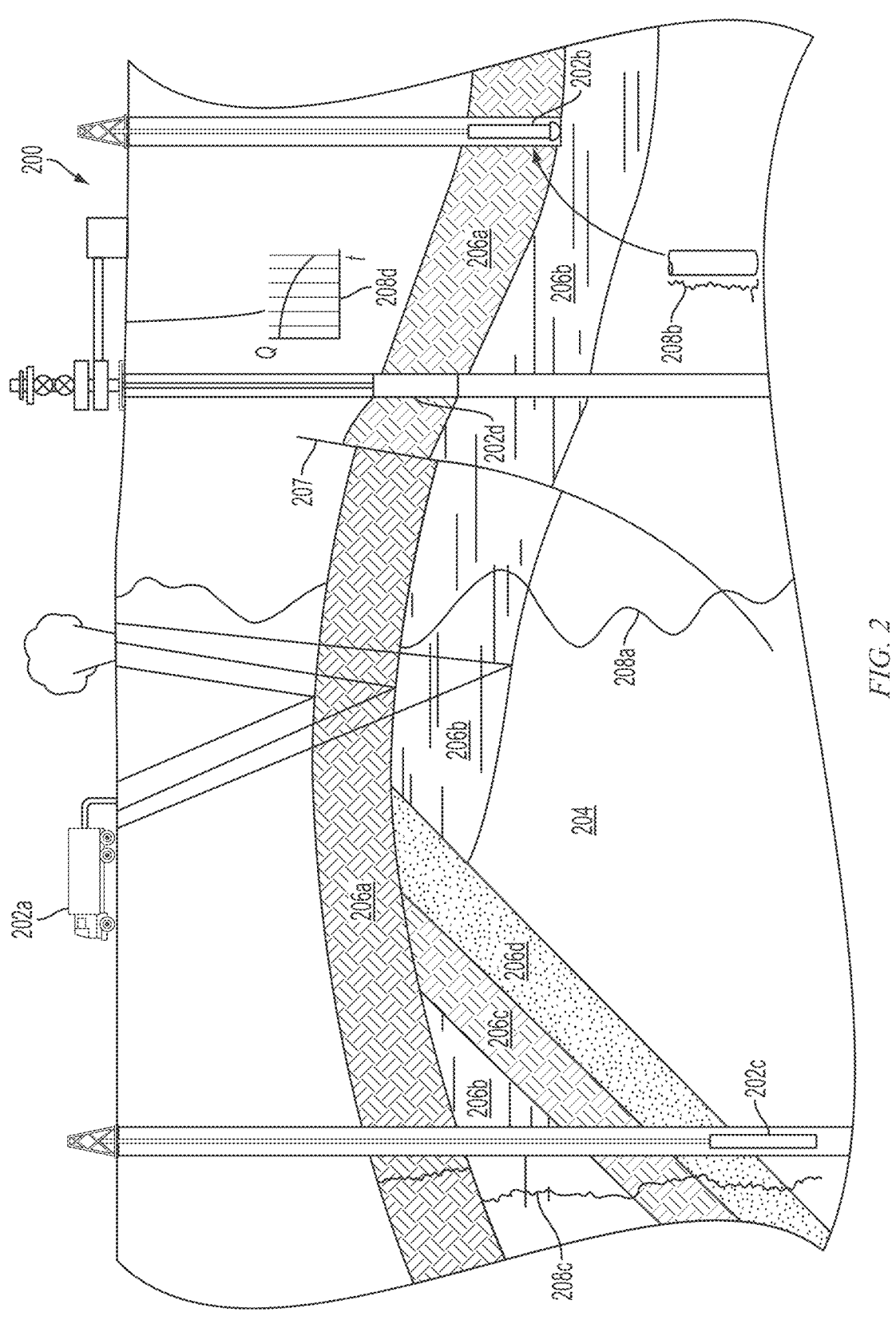
FIG. 2 shows a cross-sectional view of a resource site for which the process of FIG. 1 may be executed.

FIG. 2 shows a cross-sectional view of a resource site 200 for which the process of FIG. 1 may be executed. While the illustrated resource site 200 represents a subterranean formation, the resource site, according to some embodiments, may be below water bodies such as oceans, seas, lakes, ponds, wetlands, rivers, etc. According to one embodiment, various measurement tools capable of sensing one or more parameters such as seismic two-way travel time, density, resistivity, production rate, etc., of a subterranean formation and/or geological formations may be provided at the resource site. As an example, wireline tools may be used to obtain measurement information related to geological attributes (e.g., geological attributes of a wellbore and/or reservoir) including well log and/or chemical information. For example, the chemical information may include chemical information associated with the subsurface and/or chemical information associated with the surface/above ground areas of the resource site 200.

In some embodiments, various sensors may be located at various locations around the resource site 200 to monitor and collect data for executing the process of FIG. 4. In other embodiments, the techniques disclosed may be applied to surface seismic monitoring applications, surface gravity applications, surface electromagnetic applications, surface ground heave applications, and surface measurement of induced seismicity applications. According to some implementations, the disclosed techniques may be applied to remote sensing applications (e.g., satellite-based measurements), subsea applications associated with permanent sensors, temporary sensor applications, applications associated with remotely operated vehicles, and applications associated with aerial-based measurements (e.g., performed from planes, helicopters, and/or drones).

Part, or all, of the resource site 200 may be on land, on water, or below water. In addition, while a resource site 200 is depicted, the technology described herein may be used with any combination of one or more resource sites (e.g., multiple oil fields or multiple wellsites, one or more saline aquifers, one or more depleted oil/gas fields, etc.), one or more processing facilities, etc. As can be seen in FIG. 2, the resource site 200 may have data acquisition tools 202*a*, 202*b*, 202*c*, and 202*d* positioned at various locations within the resource site 200. The subterranean structure 204 may have a plurality of geological formations 206*a*-206*d*. As shown, this structure may have several formations or layers, including a shale layer 206*a*, a carbonate layer 206*b*, a shale layer 206*c*, and a sand layer 206*d*. A fault 207 may extend through the shale layer 206*a* and the carbonate layer 206*b*. The data acquisition tools, for example, may be adapted to take measurements and detect well log and/or chemical characteristics of the various formations shown.

While a specific subterranean formation with specific geological structures is depicted, it is appreciated that the oil field 200 may contain a variety of geological structures and/or formations, sometimes having extreme complexity. In some locations of a given geological structure, for example below a water line (e.g., aquifer) relative to the given geological structure, fluid may occupy pore spaces of the formations. Each of the measurement devices may be used to measure properties of the formations and/or other geological features. While each data acquisition tool is shown as being in specific locations in FIG. 2, it is appreciated that one or more types of measurement may be taken at one or more locations across one or more sources of the resource site 200 or other locations for comparison and/or analysis. The data collected from various sources at the resource site 200 may be processed and/or evaluated and/or used as training data, and/or used to generate high resolution result sets for characterizing a resource at the resource site, and/or used for generating resource models, etc. In one embodiment, the data collected by a set of sensors at the resource site may include data associated with the number of wells of a first reservoir or second reservoir at the resource site, data associated with the number of grid cells of the first or second reservoir, data associated with the average permeability of the first or second reservoir, data associated with the production duration history (e.g., number of years of production) of the first reservoir or second, etc.

Data acquisition tool 202*a* is illustrated as a measurement truck, which may comprise devices or sensors that take measurements of the subsurface through sound vibrations such as, but not limited to, seismic measurements. Drilling tool 202*b* may include a downhole sensor adapted to perform logging while drilling (LWD) data collection. The wireline tool 202*c* may include a downhole sensor deployed in a wellbore or borehole. Production tool 202*d* may be deployed from a production unit or Christmas tree into a completed wellbore. Examples of parameters that may be measured include weight on bit, torque on bit, subterranean pressures (e.g., underground fluid pressure), temperatures, flow rates, compositions, rotary speed, particle count, voltages, currents, and/or other parameters of operations as further discussed below.

Sensors may be positioned about the resource site to collect data relating to various resource site operations, such as sensors deployed by the data acquisition tools 202. The sensor may include any type of sensor such as a metrology sensor (e.g., temperature, humidity), an automation enabling sensor, an operational sensor (e.g., pressure sensor, $H_2S$ sensor, thermometer, depth, tension), evaluation sensors, that can be used for acquiring data regarding the formation, wellbore, formation fluid/gas, wellbore fluid, gas/oil/water comprised in the formation/wellbore fluid, or any other suitable sensor. For example, the sensors may include accelerometers, flow rate sensors, pressure transducers, electromagnetic sensors, acoustic sensors, temperature sensors, chemical agent detection sensors, nuclear sensor, and/or any additional suitable sensors. In one embodiment, the data captured by the one or more sensors may be used to characterize, or otherwise generate one or more parameter values for a high resolution result set used to, for example, label or configure a machine learning (ML) engine or a resource model as the case may require. In other embodiments, test data or synthetic data may also be used in developing the ML engine or resource model via one or more parameterization/labeling operations such as those discussed in association with the workflows presented herein.

Evaluation sensors may be featured in downhole tools such as tools 202*b*-202*d* and may include for instance electromagnetic, acoustic, nuclear, and optic sensors. Examples of tools including evaluation sensors that can be used in the framework of the current method include electromagnetic tools including imaging sensors such as FMI™ or QuantaGeo™ (mark of Schlumberger, Houston, TX); induction sensors such as Rt Scanner™ (mark of Schlumberger, Houston, TX), multifrequency dielectric dispersion sensor such as Dielectric Scanner™ (mark of Schlumberger, Houston, TX); acoustic tools including sonic sensors, such as Sonic Scanner™ (mark of Schlumberger, Houston, TX) or ultrasonic sensors, such as pulse-echo sensor as in UBI™ or PowerEcho™ (marks of Schlumberger, Houston, TX) or flexural sensors PowerFlex™ (mark of Schlumberger, Houston, TX); nuclear sensors such as Litho Scanner™ (mark of Schlumberger, Houston, TX) or nuclear magnetic resonance sensors; fluid sampling tools including fluid analysis sensors such as InSitu Fluid Analyzer™ (mark of Schlumberger, Houston, TX); distributed sensors including fiber optic. Such evaluation sensors may be used in particular for evaluating the formation in which the well is formed (i.e., determining petrophysical or geological properties of the formation), for verifying the integrity of the well (such as casing or cement properties) and/or analyzing the produced fluid (flow, type of fluid, etc.).

As shown, data acquisition tools 202*a*-202*d* may generate data plots or measurements 208*a*-208*d*, respectively. These data plots are depicted within the resource site 200 to demonstrate that data generated by some of the operations executed at the resource site 200.

Data plots 208*a*-208*c* are examples of static data plots that may be generated by data acquisition tools 202*a*-202*c*, respectively. However, it is herein contemplated that data plots 208*a*-208*c* may also be data plots that may be generated and updated in real time. These measurements may be analyzed to better define properties of the formation(s) and/or determine the accuracy of the measurements and/or check for and compensate for measurement errors. The plots of each of the respective measurements may be aligned and/or scaled for comparison and verification purposes. In some embodiments, base data associated with the plots may be incorporated into site planning, modeling a test at the resource site 200. The respective measurements that can be taken may be any of the above.

Other data may also be collected, such as historical data of the resource site 200 and/or sites similar to the resource site 200, user inputs, information (e.g., economic information) associated with the resource site 200 and/or sites similar to the resource site 200, and/or other measurement data and other parameters of interest. Similar measurements may also be used to measure changes in formation aspects over time.

Figure 3:
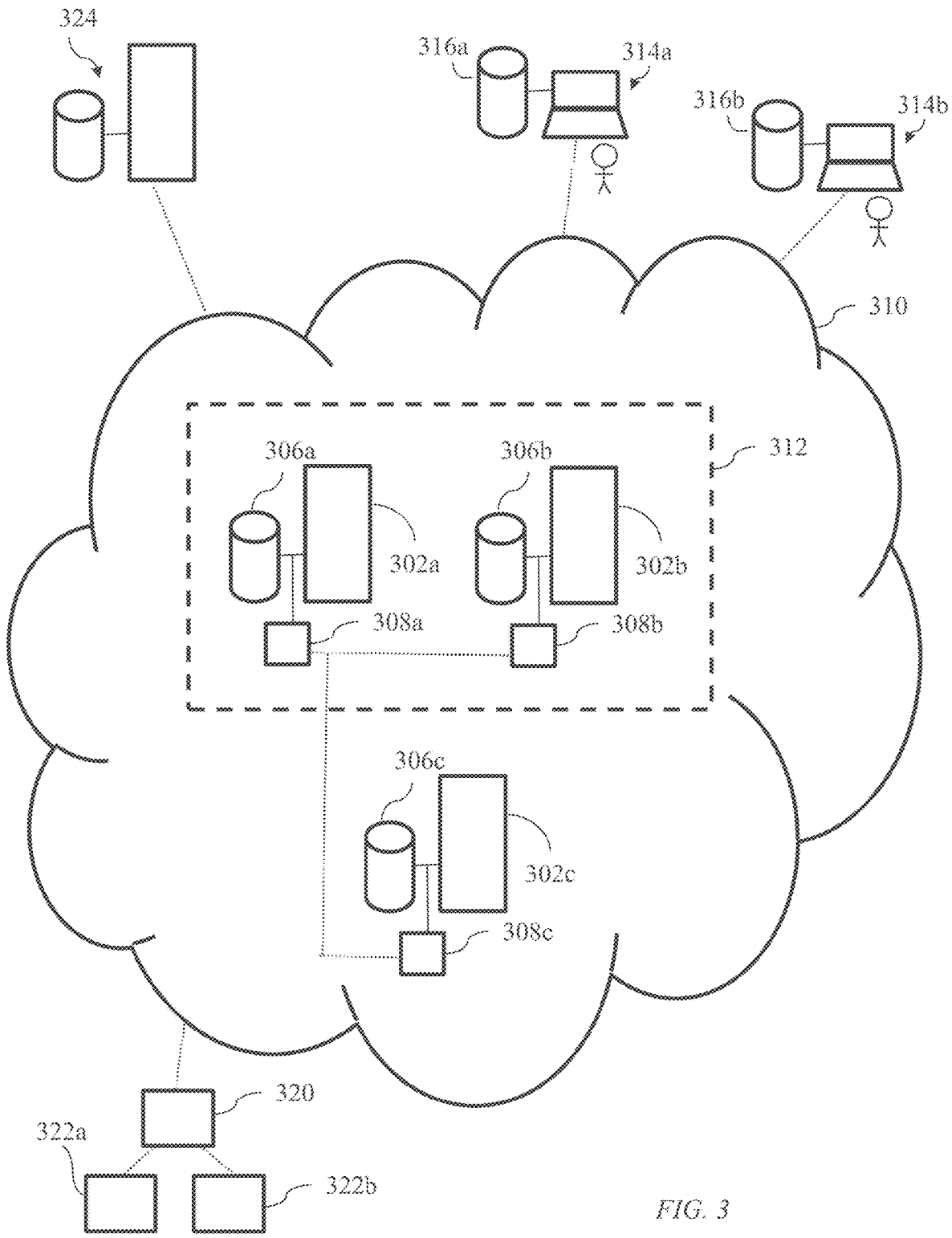
FIG. 3 shows a networked system illustrating a communicative coupling of devices or systems associated with the resource site of FIG. 2.

Computer facilities such as those discussed in association with FIG. 3 may be positioned at various locations about the resource site 200 (e.g., a surface unit) and/or at remote locations. A surface unit (e.g., one or more terminals 320) may be used to communicate with the onsite tools and/or offsite operations, as well as with other surface or downhole sensors. The surface unit may be capable of sending commands to the oil field equipment/systems, and receiving data therefrom. The surface unit may also collect data generated during production operations and can produce output data, which may be stored or transmitted for further processing.

The data collected by sensors may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis or for modeling purposes to optimize production processes at the oil field 200. In one embodiment, the data is stored in separate databases, or combined into a single database.

High-Level Networked System

FIG. 3 shows a high-level networked system diagram illustrating a communicative coupling of devices or systems associated with the resource site 200 as described in FIG. 2. The system shown in the figure may include a set of processors 302a, 302b, and 302c for executing one or more processes discussed herein. The set of processors 302 may be electrically coupled to one or more servers (e.g., computing systems) including memory 306a, 306b, and 306c that may store for example, program data, databases, and other forms of data. Each server of the one or more servers may also include one or more communication devices 308a, 308b, and 308c. The set of servers may provide a cloud-computing platform 310. In one embodiment, the set of servers includes different computing devices that are situated in different locations and may be scalable based on the needs and workflows associated with the oil field 200. The communication devices of each server may enable the servers to communicate with each other through a local or global network such as an Internet network. In some embodiments, the servers may be arranged as a town 312, which may provide a private or local cloud service for users. A town may be advantageous in remote locations with poor connectivity. Additionally, a town may be beneficial in scenarios with large networks where security may be of concern. A town in such large network embodiments can facilitate implementation of a private network within such large networks. The town may interface with other towns or a larger cloud network, which may also communicate over public communication links. Note that cloud-computing platform 310 may include a private network and/or portions of public networks. In some cases, a cloud-computing platform 310 may include remote storage and/or other application processing capabilities.

The system of FIG. 3 may also include one or more user terminals 314a and 314b each including at least a processor to execute programs, a memory (e.g., 316a and 316b) for storing data, a communication device and one or more user interfaces and devices that enable the user to receive, view, and transmit information. In one embodiment, the user terminals 314a and 314b is a computing system having interfaces and devices including keyboards, touchscreens, display screens, speakers, microphones, a mouse, styluses, etc. The user terminals 314 may be communicatively coupled to the one or more servers of the cloud-computing platform 310. The user terminals 314 may be client terminals or expert terminals, enabling collaboration between clients and experts through the system of FIG. 3.

The system of FIG. 3 may also include at least one or more resource sites 200 having, for example, a set of terminals 320, each including at least a processor, a memory, and a communication device for communicating with other devices communicatively coupled to the cloud-computing platform 310. The resource site 200 may also have a set of sensors (e.g., one or more sensors described in association with FIG. 2) or sensor interfaces 322a and 322b communicatively coupled to the set of terminals 320 and/or directly coupled to the cloud-computing platform 310. In some embodiments, data collected by the set of sensors/sensor interfaces 322a and 322b may be processed to generate a one or more resource models (e.g., reservoir models) or one or more resolved data sets used to generate the resource model which may be displayed on a user interface associated with the set of terminals 320, and/or displayed on user interfaces associated with the set of servers of the cloud computing platform 310, and/or displayed on user interfaces of the user terminals 314. Furthermore, various equipment/devices discussed in association with the resource site 200 may also be communicatively coupled to the set of terminals 320 and/or communicatively coupled directly to the cloud-computing platform 310. The equipment and sensors may also include one or more communication device(s) that may communicate with the set of terminals 320 to receive orders/instructions locally and/or remotely from the resource site 200 and also send statuses/updates to other terminals such as the user terminals 314.

The system of FIG. 3 may also include one or more client servers 324 including a processor, memory and communication device. For communication purposes, the client servers 324 may be communicatively coupled to the cloud-computing platform 310, and/or to the user terminals 314a and 314b, and/or to the set of terminals 320 at the resource site 200 and/or to sensors at the oil field, and/or to other equipment at the resource site 200.

A processor, as discussed with reference to the system of FIG. 3, may include a microprocessor, a graphical processing unit (GPU), a microcontroller, a processor module or subsystem, a programmable integrated circuit, a programmable gate array, or another control or computing device.

The memory/storage media discussed above in association with FIG. 3 can be implemented as one or more computer-readable or machine-readable storage media that are non-transitory. In some embodiments, storage media may be distributed within and/or across multiple internal and/or external enclosures of a computing system and/or additional computing systems. Storage media may include one or more different forms of memory including semiconductor memory devices such as dynamic or static random access memories (DRAMs or SRAMs), erasable and programmable read-only memories (EPROMs), electrically erasable and programmable read-only memories (EE- PROMs) and flash memories; magnetic disks such as fixed, floppy and removable disks; other magnetic media including tape; optical media such as compact disks (CDs) or digital video disks (DVDs), BluRays or any other type of optical media; or other types of storage devices. "Non-transitory" computer readable medium refers to the medium itself (i.e., tangible, not a signal) and not data storage persistency (e.g., RAM vs. ROM).

Note that instructions can be provided on one computer-readable or machine-readable storage medium, or alternatively, can be provided on multiple computer-readable or machine-readable storage media distributed in a large system having possibly plural nodes and/or non-transitory storage means. Such computer-readable or machine-readable storage medium or media is (are) considered to be part of an article (or article of manufacture). The storage medium or media can be located either in a computer system running the machine-readable instructions, or located at a remote site from which machine-readable instructions can be downloaded over a network for execution.

It is appreciated that the described system of FIG. 3 is an example that may have more or fewer components than shown, may combine additional components, and/or may have a different configuration or arrangement of the components. The various components shown may be implemented in hardware, software, or a combination of both, hardware and software, including one or more signal processing and/or application specific integrated circuits.

Further, the steps in the flowcharts described below may be implemented by running one or more functional modules in an information processing apparatus such as general-purpose processors or application specific chips, such as ASICs, FPGAs, PLDs, GPUs or other appropriate devices associated with the system of FIG. 3. For example, the flowchart of FIG. 1 as well as the flowcharts below may be executed using a signal processing engine/a data processing module (e.g., computing module) stored in memory 306a, 306b, or 306c such that the signal processing engine/data processing module includes instructions that are executed by the one or more processors such as processors 302a, 302b, or 302c as the case may be. The various modules of FIG. 3, combinations of these modules, and/or their combination with general hardware are included within the scope of protection of the disclosure. While one or more computing processors (e.g., processors 302a, 302b, or 302c) may be described as executing steps associated with one or more of the flowcharts described in this disclosure, the one or more computing device processors may be associated with the cloud-based computing platform 310 and may be located at one location or distributed across multiple locations. In one embodiment, the one or more computing device processors may also be associated with other systems of FIG. 3 other than the cloud-computing platform 310.

In some embodiments, a computing system is provided that includes at least one processor, at least one memory, and one or more programs stored in the at least one memory, such that the programs comprise instructions, which when executed by the at least one processor, are configured to perform any method disclosed herein.

In some embodiments, a computer readable storage medium is provided, which has stored therein one or more programs, the one or more programs including instructions, which when executed by a processor, cause the processor to perform any method disclosed herein. In some embodiments, a computing system is provided that includes at least one processor, at least one memory, and one or more programs stored in the at least one memory for performing any method disclosed herein. In some embodiments, an information processing apparatus for use in a computing system is provided for performing any method disclosed herein.

Embodiments

It is appreciated that the disclosed technology beneficially provides full carbonate petrophysics analysis in the absence of NMR data for wells or well logs being analyzed. In addition, the generated models (e.g., machine learning models) are able to predict or generate porosity partitions data using, for example, well log data, such that the generated porosity partitions data is substantially similar or equivalent to porosity partitions data generated using NMR data. In particular, the disclosed techniques beneficially enable the generation of carbonate permeability data, carbonate rock typing data, saturation per pore type data, and Bruggeman m. data without relying on capturing NMR data from non-NMR wells. Thus, the disclosed approach facilitates evaluating, for example, carbonate reservoirs with greater detail.

As previously noted, a signal processing engine may be used to generate a model (e.g., AI model or a machine learning model). According to one embodiment, the model comprises a random forest model with associated classification and regression analysis features. In one embodiment, the random forest model comprises a collection of decision trees that are so organized or grouped to improve the prediction performance of the machine learning model through randomized sample selection and model feature sub-setting. According to one embodiment, the machine learning model is generated using one or more of the following phases:

Phase-1: random subsets of data samples and features are picked or selected (e.g., from captured NMR data) to construct individual decision trees;

Phase-2: the constructed individual decision trees are used to generate separate data outputs;

Phase-3: the answer/target output data is selected based on an averaging operation (e.g., majority averaging operation).

In one embodiment, the workflow for training the model comprises one or more of:

(i) executing input data conditioning operations including:

cleaning and filtering input data (e.g., NMR data) prior to using said data to train the model;

numerical handling of the input data to structure said input data;

rescaling operations that enhance or broaden the amount of data that can be processed or analyzed by the model, (ii) data splitting operations including extraction of subsets from the input data into:

a training dataset (about 80% of the input data);

a testing dataset (about 20% of the input data).

(iii) feature reduction operations including assessing the impact and relevance of the ingested data inputs on the targeted output to allow reducing a dimensional space of the inputs and thereby improve the model's performance. In one embodiment, correlation operations may be executed to map appropriate inputs to outputs and thereby select the most relevant or optimal inputs that configure the model for accurately predicting target outputs considering a minimum correlation factor of about 50%;

(iv) training the machine learning model using a random forest process;

(v) executing a hyperparameter optimization process on the trained model. This can include a K-Fold technique (e.g., a K-Fold technique with 5-levels, or 6-levels, or 7-levels, etc.) that optimizes the machine learning model parameters; and (vi) executing model evaluation operations on the trained model to validate the trained model. For example, a validation metric (e.g., an $R^2$ metric) may be used to assess the performance of the model in predicting the target output.

According to one embodiment, an AI or a machine learning (ML) model is trained using a plurality of data. The plurality of data, for example, may include gamma ray data associated with an NMR well, sonic data (e.g., sonic speed or velocity data) associated with an NMR well, neutron porosity data associated with an NMR well, bulk density data associated with an NMR well, resistivity data associated with an NMR well, and/or porosity partitioning data (e.g., porosity partitioning data derived using NMR sensors) associated with an NMR well. As used herein, an NMR well, for example, comprises a well with one or more NMR sensors coupled to it to determine at least one of the aforementioned plurality of data. In some implementations, one or more of the plurality of data may be acquired using a plurality of different sensors including NMR sensors that record subsurface data including rock property data and/or fluid property data as the case may require. As noted in FIG. 1, the plurality of data, according to one embodiment may be divided into first porosity data and first well log data.

In exemplary implementations, the plurality of data referenced above in association with the AI or the ML model may be filtered or otherwise cleaned to remove noise prior to being applied or being used to train the AI or ML model. For example, the plurality of data may be subjected to processing stages prior to being applied to the AI or ML model. In one embodiment, a first processing stage to which the one or more of the plurality of data are subjected may include an initial data conditioning operation prior to being introduced to AI or ML model. For example, the NMR data comprised in the plurality of data may undergo an NMR data optimization workflow to remove noise (e.g., echo or multipath noise) via one or more filtering operations. In other embodiments, the plurality of data may be further filtered or otherwise processed to exclude zonal data comprised in the plurality of data such that the zonal data comprises data captured from one or more sections within an NMR well under consideration where the signal response or the data capturing operations is unreliable. In instances where the model is already trained, data from the non-NMR wells may be subjected to data cleaning operations that remove or otherwise eliminate null value data points comprised in the captured data associated with the non-NMR wells.

According to one embodiment, the AI or ML model is configured to have a decision tree structure that is powered by a random forest training engine or processing module. In particular, the random forest approach uses an ensemble of decision trees in which the following input data structuring may be applied:

numerical handling data operations where numerical features of the input data (e.g., the plurality aforementioned data) are kept such that the input data (e.g., NMR well logs) are ingested into the AI model with their original form; and rescaling data operations where the input data is scaled or otherwise processed to, for example, to have a standard deviation of 1 and a mean of 0. It is appreciated that the rescaling operation has no impact on the data structure of the decision trees.

According to one embodiment, a supervised or an unsupervised learning process is used to train the AI or ML model. For example, targeted data including porosity and/or well log data are first provided to train the AI or ML model in a first training loop (e.g., a simulation loop). The AI or ML model may further undergo an optimization process to statistically improve matches between specified input data items and generated target outputs after the first training loop. This AI model is then saved to be applied to other datasets in which the target outputs are missing.

After training the AI model, new data derived from, for example, one or more sensors deployed in a non-NMR well may be applied to the trained AI or ML model. The new data, according to one embodiment, comprises gamma ray data, neutron porosity data, bulk density data, sonic compression data, and resistivity data obtained from well sections where NMR measurements are not available.

According to exemplary implementations, a signal processing engine may be used to coordinate the functioning and/or predictive operations associated with the trained AI or ML model. For example, the signal processing engine may be used to replicate one or more steps or processes associated with training the AI or ML model including data conditioning operations (e.g., numerical handling of the input data structure and rescaling operations) and evaluation operations (e.g., prediction and evaluation operations). In one embodiment, the prediction operations may be based on using the trained AI or ML model or a performant archived AI or ML model as the case may require. This suggests that the disclosed approach is not restricted to just one AI or ML model but may include the use of multiple trained AI or ML models independently or concurrently as the case may require. In one embodiment, the trained AI or ML model may be subjected to validation operations in a given real number space (e.g., an $R^2$ space) to assess the performance of the AI or ML model in predicted targeted outputs.

According to one embodiment, the trained ML model may be used to generate or otherwise predict output data such as those discussed in association with blocks 108-118. This output data, for example, may indicate log-type data of the target porosity partitions with similar or dissimilar sampling rate/size relative to the input logs applied to the AI or ML model.

Furthermore, the prediction output data (e.g., porosity partition data) may provide valuable information that have several applications in energy development including:

improving or optimizing petrophysical characterization of the rock types associated with a non-NMR well;

enhancing understanding of the flow dynamics in carbonate reservoirs to which the non-NMR well is coupled and which is required for generating successful field development plans;

optimizing completion design and well test operations or perforation zone selection operations based on the distribution of the porosity partitions; and optimizing the mud design (e.g., mud weight, solid content, and particle size characterizations in the subsurface of a resource site) associated with non-NMR wells based on pore presence data comprised in the prediction output data (e.g., macropore data, vuggy data, etc.) that can act as loss zones during drilling.

FIG. 4 provides an exemplary workflow for methods, systems, and computer programs for generating petrophysical analysis data for energy development operations. For example, the disclosed techniques may be implemented as a signal processing engine within a geological software tool such that the signal processing engine enables the modeling of geological structures in the subsurface of the resource site based on the processes outlined herein.

At block 402, the signal processing engine may access a database which comprises: first porosity data associated with a nuclear magnetic resonance (NMR) well; and first well log data associated with the NMR well. The signal processing engine may be used, at block 404, to randomly select one or more data elements comprised in the first porosity data and the first well log data. At block 406, the signal processing engine may be used to develop, based on the randomly selected first porosity data and first well log data, a learning data structure. Turning to block 408, the signal processing engine may generate based on the learning data structure, a machine learning model. Generating the machine learning model, according to one embodiment, may comprise: configuring one or more parameters of the machine learning model based on the randomly selected first porosity data and first well log data; adapting or changing the one or more parameters of the machine learning model during a simulation involving the machine learning model; and validating the machine learning model by determining a prediction schema or an expected value set based on transforming the one or more parameters of the machine learning model into variable input parameters that generate second porosity data comprised in, or associated with the expected value set. The variable input parameters, for example, may comprise configurable or tunable or adaptive input parameters that are configurable and/or tunable and/or changeable based on: the data elements from at least one of the first porosity data and/or first well log data to generate specific output data comprised in the prediction schema or the expected value set during the training phase; and data from non-NMR wells (e.g., second well log data) during the implementation or post-training phase of the machine learning model.

At block 410, the signal processing engine may receive second well log data using one or more sensors deployed about a non-NMR well. Following this the signal processing engine may adapt, at block 412, based on the second well log data, the variable input parameters of the machine learning model to generate the second porosity data comprised in the expected value set and associated with the non-NMR well. In addition, the signal processing engine may format, at block 414, the second porosity data to generate petrophysical analysis data. The petrophysical analysis data, according to one embodiment, comprises a visualization indicating one or more of: a petrophysical characterization of a rock type associated with the non-NMR well; flow dynamic data of a carbonate reservoir associated with the non-NMR well; well test or perforation zone data associated with the non-NMR well; and pore data associated with the non-NMR well.

In other embodiments, a system and a computer program can include or execute the method described above. These and other implementations may each optionally include one or more of the following features. The first porosity data may include at least one of first micro-porosity data, first meso-porosity data, and first macro-porosity data. In addition, the first well log data may include at least one of first sonic velocity data, first bulk density data, first resistivity data, and first gamma ray data. According to one embodiment, the first porosity data and the first well log data, in aggregate, are split into a training dataset and a testing data set prior to being used to generate the machine learning model. Moreover, the second porosity data may be used to generate one or more of: carbonate rock data comprised in the petrophysical analysis data; carbonate permeability data comprised in the petrophysical analysis data; and Bruggeman m data with corresponding Archie saturation data.

According to some implementations, the learning data structure comprises a random forest learning data structure including a collection of decision trees that are organized based on the randomly selected porosity data and well log data.

In exemplary implementations, the petrophysical analysis data is used to generate a development plan for a resource site that drives energy exploration operations including: drilling specific areas of the resource site; or placing one or more of wells or energy exploration equipment at the resource site. Furthermore, the pore data discussed in association with block 414 of FIG. 4 may be used to inform execution of drilling operations at the resource site.

Furthermore, the adapting or changing the one or more parameters of the machine learning model during the simulation involving the machine learning model discussed in association with block 408 of FIG. 4 comprises executing one of: a supervised learning operation on the machine learning model based on configuring the one or more parameters of the machine learning model based on the randomly selected first porosity data and first well log data; or an unsupervised learning operation on the machine learning model based on configuring the one or more parameters of the machine learning model based on the randomly selected first porosity data and first well log data. It is appreciated that the machine learning model is trained using data derived from a first well about which is deployed one or more NMR sensors. It is further appreciated that the machine learning model is applied to data derived from a second well about which there is no deployed NMR sensor.

FIG. 5 provides an exemplary visualization comprised in the petrophysical analysis data. As can be seen in the figure, a first petrophysical analysis data 506 derived from data 502 of an NMR well is compared with a second petrophysical analysis data 508 derived from applying second well log data 504 (e.g., derived from a non-NMR well) to the machine learning model. As can be seen in the figure, the first petrophysical data 506 is substantially similar to the second petrophysical analysis data 508. It is appreciated that contents of FIG. 5 can be used as basis for validating the performance of the machine learning model as the case may require.

While any discussion of or citation to related art in this disclosure may or may not include some prior art references, Applicant neither concedes nor acquiesces to the position that any given reference is prior art or analogous prior art.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to explain the principles of the invention and its practical applications, to thereby enable others skilled in the art to use the invention and various embodiments with various modifications as are suited to the particular use contemplated. It is appreciated that the term optimize/optimal and its variants (e.g., efficient or optimally) may simply indicate improving, rather than the ultimate form of 'perfection' or the like.

It will also be understood that, although the terms first, second, etc., may be used herein to describe various elements, these elements should not be limited by these terms. These terms are used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description herein is for the purpose of describing particular embodiments and is not intended to be limiting. As used in the description of the invention and the appended claims, the singular forms "a," "an" and "the" are intended to include the plural forms as well, unless the context clearly indicates otherwise. It will also be understood that the term "and/or" as used herein refers to and encompasses any possible combination of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context.

Those with skill in the art will appreciate that while some terms in this disclosure may refer to absolutes, e.g., all source receiver traces, each of a plurality of objects, etc., the methods and techniques disclosed herein may also be performed on fewer than all of a given thing, e.g., performed on one or more components and/or performed on one or more source receiver traces. Accordingly, in instances in the disclosure where an absolute is used, the disclosure may also be interpreted to be referring to a subset.

What is claimed is:

1. A method for generating petrophysical analysis data for energy development operations, the method comprising:

accessing, using a computer processor, a database including:

first porosity data associated with a nuclear magnetic resonance (NMR) well, and first well log data associated with the NMR well;

randomly selecting, using the computer processor, one or more data elements included in the first porosity data and the first well log data;

developing, using the computer processor and based on the randomly selected first porosity data and first well log data, a learning data structure;

generating, using the computer processor and based on the learning data structure, a machine learning model, the generating including:

configuring one or more parameters of the machine learning model based on the randomly selected first porosity data and first well log data, adapting or changing the one or more parameters of the machine learning model during a simulation involving the machine learning model, and validating the machine learning model by determining an expected value set based on transforming the one or more parameters of the machine learning model into variable input parameters that generate second porosity data included in, or associated with the expected value set;

receiving, using the computer processor, second well log data using one or more sensors deployed about a non-NMR well;

adapting, using the computer processor and based on the second well log data, the variable input parameters of the machine learning model to generate the second porosity data included in the expected value set and associated with the non-NMR well; and formatting, using the computer processor, the second porosity data to generate petrophysical analysis data, the petrophysical analysis data including a visualization indicating one or more of:

a petrophysical characterization of a rock type associated with the non-NMR well, flow dynamic data of a carbonate reservoir associated with the non-NMR well, well test or perforation zone data associated with the non-NMR well, and pore data associated with the non-NMR well.

2. The method of claim 1, wherein:

the first porosity data includes at least one of first microporosity data, first meso-porosity data, and first macroporosity data; and the first well log data includes at least one of first sonic velocity data, first bulk density data, first resistivity data, and first gamma ray data.

3. The method of claim 1, wherein the first porosity data and the first well log data, in aggregate, are split into a training dataset and a testing dataset prior to being used to generate the machine learning model.

4. The method of claim 1, wherein the learning data structure includes a random forest learning data structure including a collection of decision trees that are organized based on the randomly selected first porosity data and first well log data.

5. The method of claim 1, wherein the second porosity data is used to generate carbonate rock data included in the petrophysical analysis data.

6. The method of claim 1, wherein the second porosity data is used to generate carbonate permeability data included in the petrophysical analysis data.

7. The method of claim 1, wherein the second porosity data is used to generate Bruggeman m data with corresponding Archie saturation data.

8. The method of claim 1, wherein the petrophysical analysis data is used to generate a development plan for a resource site that drives energy exploration operations including:

drilling specific areas of the resource site; or placing one or more of wells or energy exploration equipment at the resource site.

9. The method of claim 8, wherein the pore data informs execution of drilling operations at the resource site.

10. The method of claim 1, wherein the adapting or changing the one or more parameters of the machine learning model during the simulation involving the machine learning model includes executing one of:

a supervised learning operation on the machine learning model based on configuring the one or more parameters of the machine learning model based on the randomly selected first porosity data and first well log data, or an unsupervised learning operation on the machine learning model based on configuring the one or more parameters of the machine learning model based on the randomly selected first porosity data and first well log data.

11. The method of claim 1, wherein:

the machine learning model is trained using data derived from a first well about which there is deployed one or more NMR sensors; and the machine learning model is applied to data derived from a second well about which there is no deployed NMR sensor.

12. A system for generating petrophysical analysis data for energy development operations, the system comprising:

a computer processor, and memory storing a data processing engine that includes instructions which are executable by the computer processor to:

access a database including:

first porosity data associated with a nuclear magnetic resonance (NMR) well, and first well log data associated with the NMR well;

randomly select one or more data elements included in the first porosity data and the first well log data;

develop, based on the randomly selected first porosity data and first well log data, a learning data structure;

generate, based on the learning data structure, a machine learning model, wherein to generate the machine learning model includes:

configuring one or more parameters of the machine learning model based on the randomly selected first porosity data and first well log data, adapting or changing the one or more parameters of the machine learning model during a simulation involving the machine learning model, and validating the machine learning model by determining an expected value set based on transforming the one or more parameters of the machine learning model into variable input parameters that generate second porosity data included in, or associated with the expected value set;

receive second well log data using one or more sensors deployed about a non-NMR well;

adapt, based on the second well log data, the variable input parameters of the machine learning model to generate the second porosity data included in the expected value set and associated with the non-NMR well; and format the second porosity data to generate petrophysical analysis data, the petrophysical analysis data including a visualization indicating one or more of:

a petrophysical characterization of a rock type associated with the non-NMR well, flow dynamic data of a carbonate reservoir associated with the non-NMR well, well test or perforation zone data associated with the non-NMR well, and pore data associated with the non-NMR well.

13. The system of claim 12, wherein:

the first porosity data includes at least one of first microporosity data, first meso-porosity data, and first macroporosity data; and the first well log data includes at least one of first sonic velocity data, first bulk density data, first resistivity data, and first gamma ray data.

14. The system of claim 12, wherein the first porosity data and the first well log data, in aggregate, are split into a training dataset and a testing dataset prior to being used to generate the machine learning model.

15. The system of claim 12, wherein the learning data structure includes a random forest learning data structure including a collection of decision trees that are organized based on the randomly selected first porosity data and first well log data.

16. The system of claim 12, wherein:

the second porosity data is used to generate carbonate rock data included in the petrophysical analysis data;

the second porosity data is used to generate carbonate permeability data included in the petrophysical analysis data; and the second porosity data is used to generate Bruggeman m data with corresponding Archie saturation data.

17. A non-transitory computer-readable medium storing a computer program for generating petrophysical analysis data for energy development operations, the computer program is executable by a processor to:

access a database including:

first porosity data associated with a nuclear magnetic resonance (NMR) well, and first well log data associated with the NMR well;

randomly select one or more data elements included in the first porosity data and the first well log data;

develop, based on the randomly selected first porosity data and first well log data, a learning data structure;

generate, based on the learning data structure, a machine learning model, wherein to generate the machine learning model includes:

configuring one or more parameters of the machine learning model based on the randomly selected first porosity data and first well log data, adapting or changing the one or more parameters of the machine learning model during a simulation involving the machine learning model, and validating the machine learning model by determining an expected value set based on transforming the one or more parameters of the machine learning model into variable input parameters that generate second porosity data included in, or associated with the expected value set;

receive second well log data using one or more sensors deployed about a non-NMR well;

adapt, based on the second well log data, the variable input parameters of the machine learning model to generate the second porosity data included in the expected value set and associated with the non-NMR well; and format the second porosity data to generate petrophysical analysis data, the petrophysical analysis data including a visualization indicating one or more of:

a petrophysical characterization of a rock type associated with the non-NMR well, flow dynamic data of a carbonate reservoir associated with the non-NMR well, well test or perforation zone data associated with the non-NMR well, and pore data associated with the non-NMR well.

18. The non-transitory computer readable medium of claim 17, wherein the first porosity data includes at least one of first microporosity data, first meso-porosity data, and first macroporosity data; and the first well log data includes at least one of first sonic velocity data, first bulk density data, first resistivity data, and first gamma ray data.

19. The non-transitory computer readable medium of claim 17, wherein the learning data structure includes a random forest learning data structure including a collection of decision trees that are organized based on the randomly selected first porosity data and first well log data.

20. The non-transitory computer readable medium of claim 17, wherein the second porosity data is used to generate carbonate rock data included in the petrophysical analysis data;

the second porosity data is used to generate carbonate permeability data included in the petrophysical analysis data; and the second porosity data is used to generate Bruggeman m data with corresponding Archie saturation data.

\* \* \* \* \*